(12) United States Patent
Ahmad-Taylor et al.

(10) Patent No.: US 8,009,426 B2
(45) Date of Patent: Aug. 30, 2011

(54) HOUSING FOR PROTECTING ELECTRONIC COMPONENTS HAVING VENTS

(75) Inventors: Ty O. Ahmad-Taylor, New York, NY (US); Gregory Edelin, Berkeley, CA (US)

(73) Assignee: Comcast Cable Holdings LLC, Philadelphia, PA (US)

( * ) Notice: Subject to any disclaimer, the term of this patent is extended or adjusted under 35 U.S.C. 154(b) by 305 days.

(21) Appl. No.: 12/094,483

(22) PCT Filed: Nov. 22, 2006

(86) PCT No.: PCT/US2006/045229
§ 371 (c)(1),
(2), (4) Date: Oct. 2, 2008

(87) PCT Pub. No.: WO2007/089321
PCT Pub. Date: Aug. 9, 2007

(65) Prior Publication Data
US 2009/0097201 A1     Apr. 16, 2009

Related U.S. Application Data

(60) Provisional application No. 60/739,470, filed on Nov. 23, 2005, provisional application No. 60/791,756, filed on Apr. 13, 2006.

(51) Int. Cl.
*H05K 7/20* (2006.01)
*H05K 5/00* (2006.01)
*A47B 77/08* (2006.01)

(52) U.S. Cl. ........ 361/692; 361/693; 361/690; 454/184; 312/236; 174/547

(58) Field of Classification Search .......... 361/692–693; 454/184; 312/236; 174/547; D14/125–134, D14/239, 371, 374–376, 135, 136, 492, 299, D14/356, 361–363, 365, 496
See application file for complete search history.

(56) References Cited

U.S. PATENT DOCUMENTS

| | | | |
|---|---|---|---|
| 5,440,450 A | 8/1995 | Lau et al. | |
| D419,988 S * | 2/2000 | Brunner et al. | D14/125 |
| D462,954 S * | 9/2002 | Chen | D14/299 |
| 6,454,646 B1 * | 9/2002 | Helgenberg et al. | 454/184 |
| D510,729 S * | 10/2005 | Chen et al. | D14/125 |
| 6,963,489 B2 | 11/2005 | Askeland et al. | |
| D531,142 S | 10/2006 | Yang et al. | |
| 7,158,380 B2 * | 1/2007 | Green et al. | 361/704 |
| D545,774 S * | 7/2007 | Woo et al. | D14/125 |
| 7,315,445 B2 | 1/2008 | Kirby et al. | |
| 2003/0156385 A1 * | 8/2003 | Askeland et al. | 361/687 |
| 2004/0134253 A1 * | 7/2004 | Kim | 72/379.2 |
| 2007/0064109 A1 | 3/2007 | Renkis | |

FOREIGN PATENT DOCUMENTS

GB          2336510          * 10/1999

* cited by examiner

*Primary Examiner* — Zachary M Pape
(74) *Attorney, Agent, or Firm* — Banner & Witcoff, Ltd.

(57) ABSTRACT

Settop box (STB) or other housing for use in protecting electronic components. The housing may include an interior portion for protecting the components. The housing may include feet on a bottom and side to facilitate stabilizing the STB in a vertical and horizontal position. The housing may include vents to facilitate air flow to the interior. The vents may be associated with blocking aspects to protect against blocking the vents.

18 Claims, 5 Drawing Sheets

HOUSING FOR PROTECTING ELECTRONIC COMPONENTS HAVING VENTS

CROSS-REFERENCE TO RELATED APPLICATION

This application claims the benefit of U.S. provisional application Ser. No. 60/739,470 filed Nov. 23, 2005 and 60/791,756 filed Apr. 13, 2006.

BACKGROUND OF THE INVENTION

1. Field of the Invention

The present invention relates to settop boxes (STBs) and other devices used to house electronic components, such as but not limited to STBs of the type common employed to process television signaling for output to a television or other display device.

2. Background Art

Electronic devices may include any number of electronic components and features within a housing or enclosure. The housing may include one more pieces that together encapsulate or otherwise protect the components and circuit when the device is in use. Settop boxes (STBs) are one of many types of such devices. STBs are commonly employed to process television, data, and other signals for output to a television or other display.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
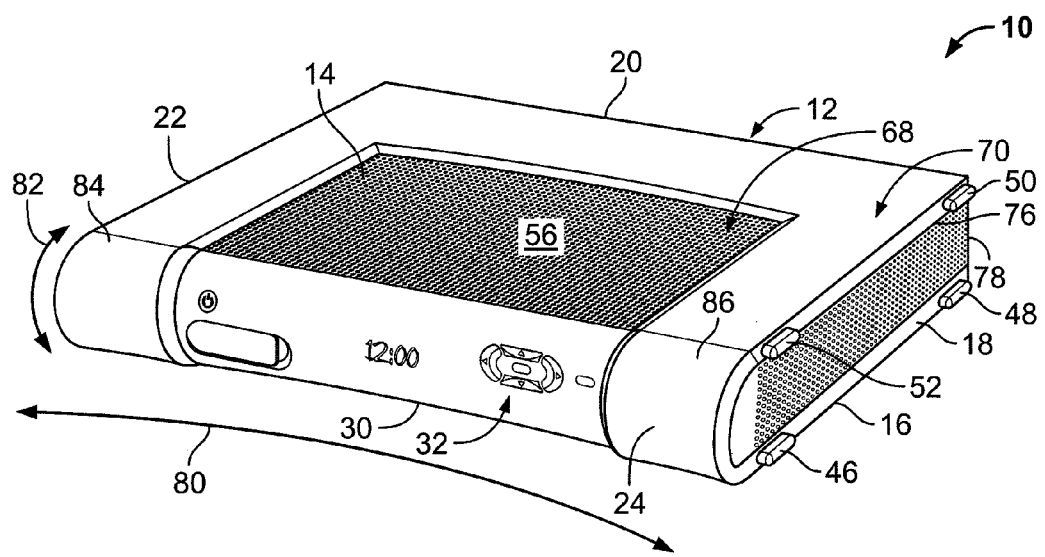
FIG. 1 illustrates a settop box (STB) in accordance with one non-limiting aspect of the present invention.

FIG. 1 illustrates a settop box (STB) 10 in accordance with one non-limiting aspect of the present invention. The STB 10 is intended to refer to any case or packaging having properties sufficient to protect electrical components, circuits, and other features stored therein. For exemplary purposes only and without intending to limit the scope and contemplation of the present invention, the present invention is most predominately described with respect to the STB 10 being configured to support descrambling and other processing of television signals and other signals associated with the signaling associated with television viewing, including but not limited to signals associated with high speed data (HSD) and the like.

The components and features included with the STB 10 may vary depending on the signal being processes, and therefore, are not show in detail. The present invention fully contemplates the STB 10 including any number of features associated with supporting any number of services, including but not limited to features and components associated with supporting, integrating, or otherwise providing television and non-television services and applications, such as, but not limited to email services, data transmission service, linear and non-linear television programming/signaling (cable, satellite, broadcast, etc.), Video on Demand (VOD), interactive television (iTV), interactive gaming, pay-per-view (PPV), digital video recording (local and remote), and/or broadcasting of signals associated with supporting television programming, movies, audio, and other multimedia, as well as, downloading of clips or full-length versions of the same.

Figure 2:
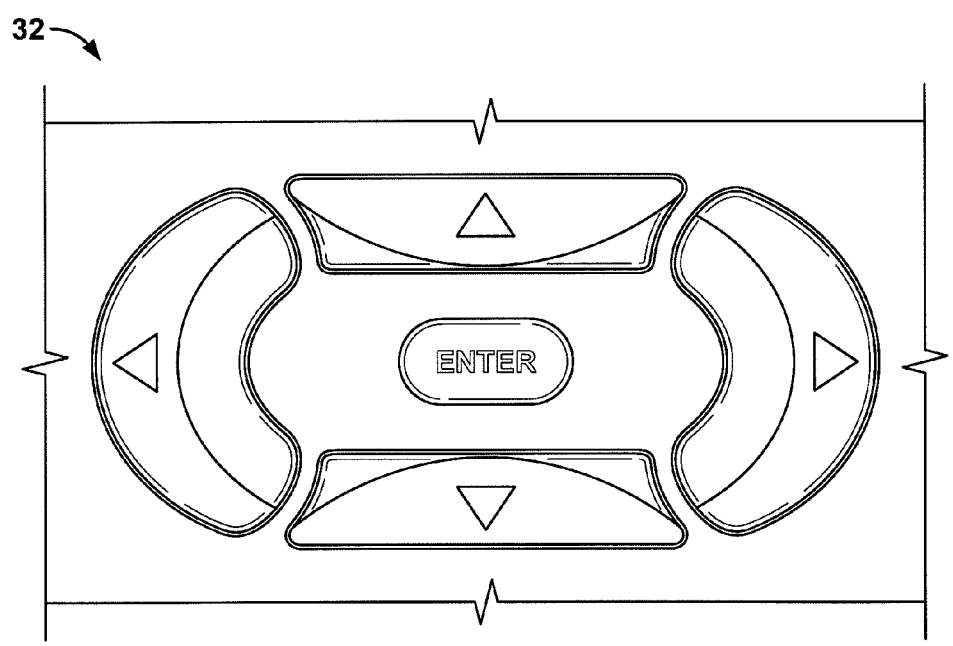
FIG. 2 illustrates a navigation cluster in accordance with one non-limiting aspect of the present invention.

The STB 10 may include a housing 12 associated with a top 14 and bottom 16 with sides 18-24 extending therebetween. The components and other features associated with the operation of the STB 10 may be included within a cavity or interior defined by the top, bottom, and sides 18-24. A front side 24 may include a display 30 to facilitate displaying information associated with operation of the STB 10. A navigation cluster 32 may be included to facilitate user interaction and other controls related to the operation of the STB 10. The navigation cluster 32 may include four navigation buttons (up, down, left, right) and an enter button, which may optionally match corresponding buttons on a remote control (not shown) that may also be used to facilitate controls associated with the operation of the STB 10. FIG. 2 illustrates the navigation cluster 32 in accordance with one non-limiting aspect of the present invention.

Figure 3:
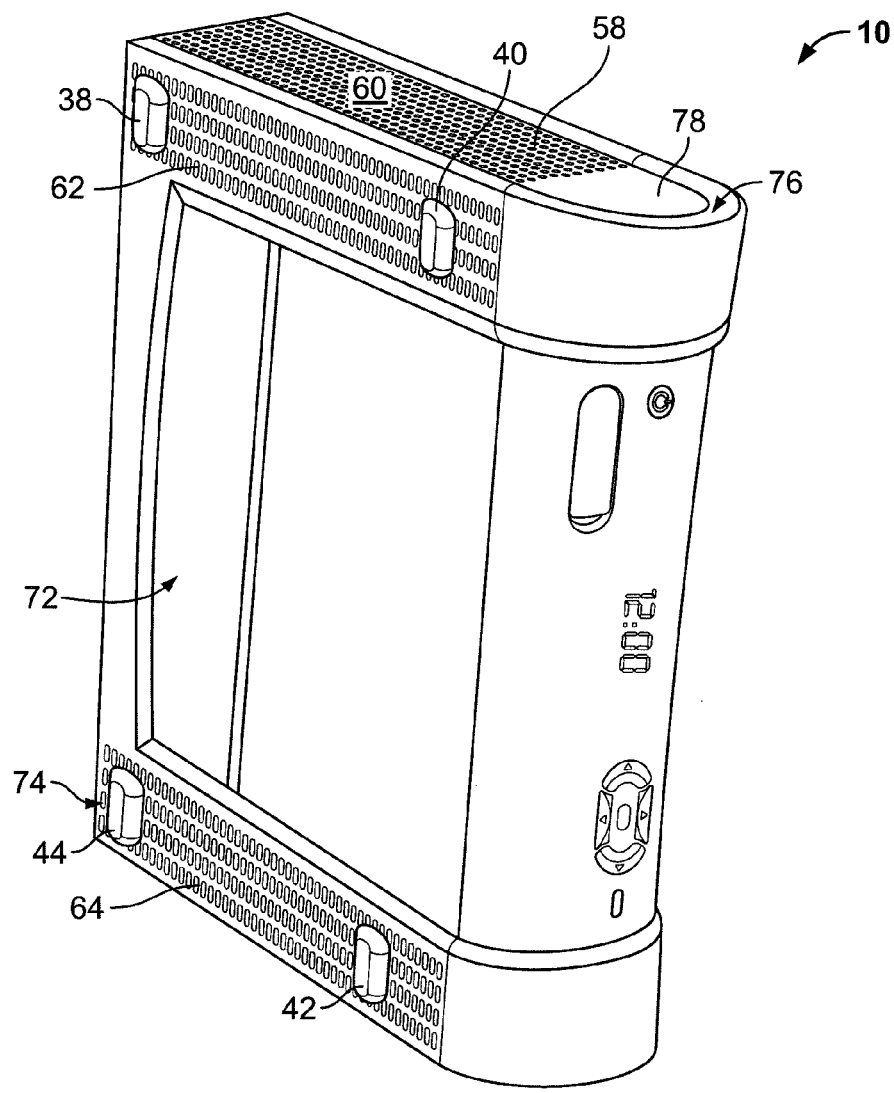
FIG. 3 illustrates the STB orientated in a vertical position in accordance with one non-limiting aspect of the present invention.

FIG. 1 illustrates the STB 10 orientated in a horizontal position. FIG. 3 illustrates the STB 10 orientated in a vertical position. Feet 38-52 may be included on the bottom 16 and right side 18 to facilitate respectively orientating the STB 10 in the horizontal and vertical positions. The feet 38-52 may offset the respective bottom and side from a surface upon which it rests so as to facilitate the flow of air to vents. This may be one type of blocking aspect helpful in protecting against blocking vent groupings 56-64. Some or all of the vents may be apertures or other pathways for air to flow to the interior of the housing 12. The flow of air may facilitate cooling operations associated with the electronics within the housing 12. The vents are generally shown to be coplanar with each successive vent within a grouping of vents, however, one or more of the vents with a grouping may be undulated or otherwise include varying elevations. This may be one type of blocking aspect helpful in protecting against blocking the vents.

The top 14 may include a central top portion 68 sunken blow an outer rim portion 70. A portion of the vents 56 may correspond with the sunken portion 68 such that the vents 56 are located below an elevation of the outer rim 70. The elevational difference between the vents 56 and the outer rim 70 may be one type of blocking aspect helpful in protecting against blocking the vents 56. A planar object or other objects resting on top of the vents 56 and the outer rim 70 may be deflected, angled, or otherwise position due to the elevation differences such that the ability of the items to lay flat against the vents 56 is limited. This may be on type of blocking aspect useful in protecting against blocking the vents 56 so as to facilitate the continued flow of air to the components stored within the housing.

The bottom 16 may include a central bottom 72 portion sunken below an outer rim portion 74. Vents 62-64 may be included on the outer rim portion 74 and/or on the central sunken portion 72. For exemplary purposes, the vents 62-64 are shown to be included on the outer rim portion 74. The elevational difference between the vents 62-64 and the sunken portion 72 may be one type of blocking aspect helpful in protecting against blocking the vents 62-64. A planar object or other objects resting on top of the vents 62-64 and the sunken portion may be deflected, angled, or otherwise position due to the elevation differences such that the ability of the items to lay flat against the vents 62-64 is limited. This may be on type of blocking aspect useful in protecting against blocking the vents 62-64 so as to facilitate the continued flow of air to the components stored within the housing.

The outer rim portion 70 on the top may align or otherwise correspond with the bottom rim portion 74 such that the sides or rims and/or the entire rims correspond with the same dimension such that the corresponding portions are mirror images of each other. This may be helpful in facilitating stacking one STB 10 on top of another. When two or more STBs 10 are stacked on top of each other, the top outer rim 70 may rest on the bottom outer rim 74 such that the vents therebetween are sunken below the respective outer rims so as to facilitate air flow. Optionally, the outer rim portions 70 and 74 may extend partially around the sunken portions, i.e., around all sides except for the illustrated front side 24, so as to provide a gap for air flow when the STBs 10 are stacked. The feet 38-44 on the bottom may correspond with the bottom outer rim 74 and/or the top outer rim 70 of a stacked STB to further offset the STBs from each other and facilitate air flow. Such blocking aspects may be helpful in preventing against blocking the vents when the STBs are stacked. Optionally, the rear side portion of the outer rim portions of the top and/or bottom may be related to the corresponding sunken portions so as to provide a handgrip or finger-grip so as to facilitate grabbing and lifting the STB from the rear side.

The sides 18 and 22 may include an out rim portion 76 and an arced portion 78. The arch portion 78 may extend outwardly beyond the outer rim portion 76. Vents 58-60 may be included along the arched portion 78 such that an elevation difference occurs between a portion of the vents 58-60 along the arc and between the outer rim portion 76. When the STB 10 is vertically aligned on either side, the arched vent portions 78 prevent the vents 58-60 from being blocked so as to facilitate air flow to the interior portions. The feet 46-52 on the right side 18 may extend outwardly of an apex of the arced portion 78 so as to secure the STB 10 when vertically aligned. The arched vents 58-60 and/or outwardly extending feet 46-52 may be one type of blocking aspect helpful in protecting against blocking the vents.

Figure 4:
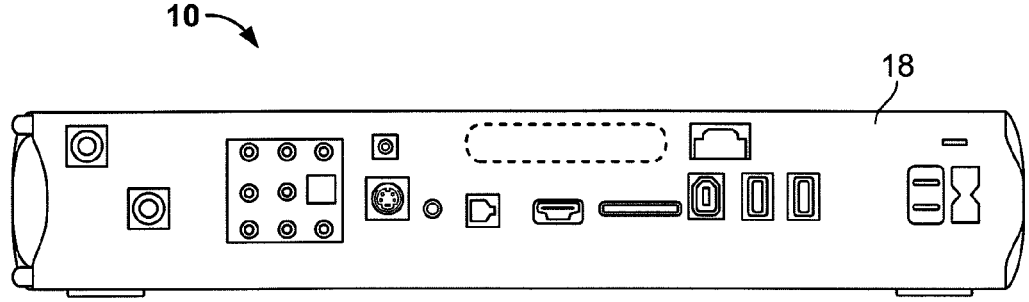
FIG. 4 illustrates as rear side view of the STB in accordance with one non-limiting aspect of the present invention.

The front side 24 may be curved or arched inwardly from side to side and/or outwardly from top to bottom. The inward arching is generally shown with reference line 80 and extends from the left side 22 to the right side 18. The inward arching may be helpful in protecting the display 30 from scratching and other damage. Technicians and other individuals working with the STB 10 typically desire access to rear side 20 of the STB 10 such that the display 30—front side—is often placed against a surface while the rear side is being accessed. (FIG. 4 illustrate as rear side view of the STB.) The inward curvature of the front side 24 helps to protect the display when positioned facedown or otherwise.

The outward, top to bottom curvature or arching is generally shown with reference line 82 and may correspond with ribs or wraps 84-86 associated with the outer rim portion of the top and bottom wrapping around from the top to the corresponding bottom portion. These ribs 84-86 may extend outwardly of the display 30 to help protect the display 30 against damage when placed facedown. Optionally, in addition to or in place of being arched inwardly, the display 30 may be correspondingly curved outwardly from top to bottom to correspond with the general curvature of the ribs 84-86. This may be helpful in presenting an aesthetically appeal front side 24. The top to bottom curvature of the front side 24 may be advantageous in promoting storage, packaging, and other positioning of the STB 10 relative to the flat rear side as the curvature may tend to make facedown placement (front side down) more difficult relative to upright placement (rear side down).

FIG. 4 illustrates a number of ports and connections that may be accessible from the rear side 20 of the STB 10. Any number of ports and connections may be included without deviating from the scope and contemplation of the present invention. The connector components come in a variety of shapes and sizes. The rear panel may be required to be full height (3") for at least half of its width (6.5" of 13"). The specific layout of the rear panel may be reviewed and detailed after the specific component details are determined. The ports may include but are not limited to a power connector for a power cord, a power outlet for plugging in an external device, a composite Video (RGB), a component Video (2x RCA), an audio 1 (2x RCA), an audio 2 (2x RCA), a USB (X2), a non-standard USB security port, a coax in, a coax out, a SPDIF, a HDMI, a SATA, a RJ45 (Ethernet), a M11, a Cable Card Input, and/or a serial number bar code (for operations) space permitting The ports may operate with the electronic components included within the interior, which may include a hard drive, signal processor, conditional access unit, power supply, etc. Optionally, these and other heat generating components may be positioned relative to the vents and well ventilated areas such that the components are able to cool through convection based air flow and without forced air flow from a fan included within the interior. The components and ports may be arranged to stabilize the STB 10. For example, the coaxial ports may be located proximate the right side feet 46-52 to facilitate stabilizing the STB 10 from torque and other forces associated with the coaxial connection. Similarly, heavier components within the STB 10 may be positioned to facilitate stabilization.

Figure 5:
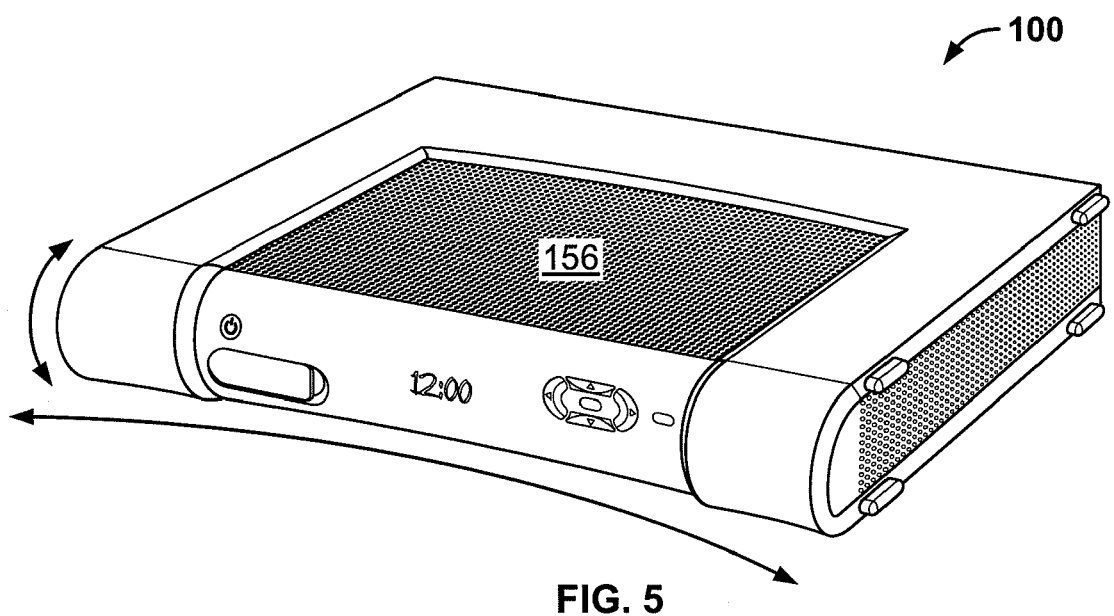
FIGS. 5-6 illustrate a STB in accordance with one non-limiting aspect of the present invention.
Figure 6:
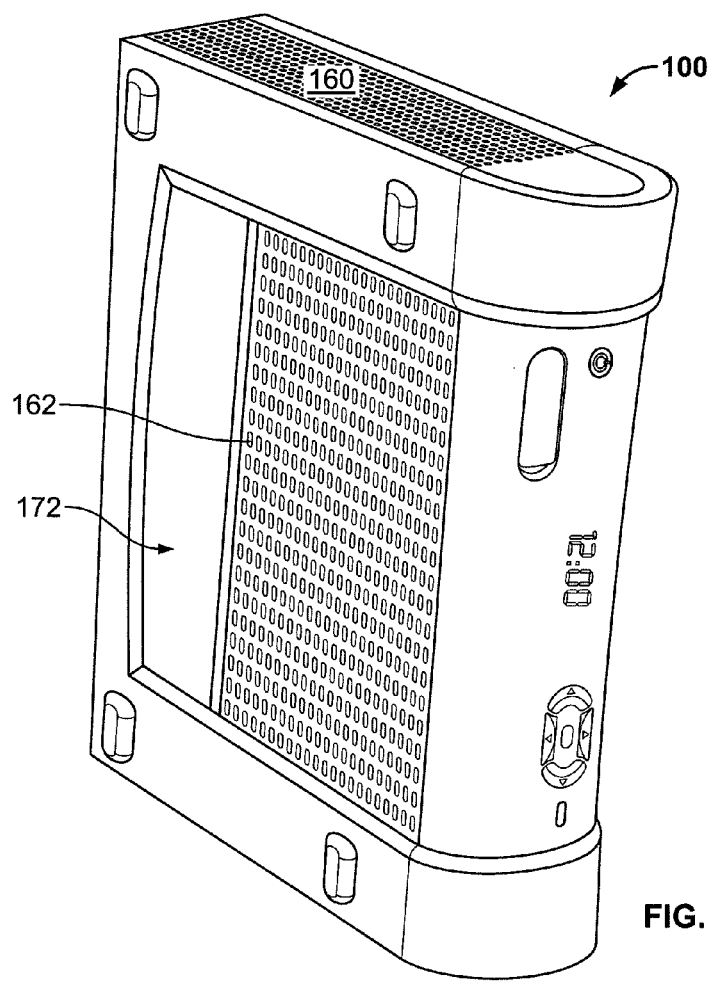

FIGS. 5-6 illustrate another STB 100 in accordance with one non-limiting aspect of the present invention. The STB 100 may include features similar to those describe above for the STB 10, such as but not limited to the commonly illustrated features. The STB 100 may differ from the above STB 10 in that it may relay on a fan to sufficiently cool the interior due to a limited number of vents. While shown to include top and bottom venting 156 and 162, the top, bottom, and a portion of the left side venting 160 may optionally be half-punched vents which look like vents but do not extend through the materials such that, unlike the full, through-hole vents, the half-vents fail to deliver air to the interior portion. Such half-vents or fake vents may be useful with MSO products lines having STBs from different STB vendors. The corresponding appearance of each STBs 10 and 100 of the present invention may be helpful in providing an aesthetic scheme for the MSO even though the MSO relies upon different STB vendors having different design constraints.

A portion of the vents associated with the bottom portion may differ from the above described STB in that the vents may correspond with the sunken portion 172 such that the vents are located below an elevation of the outer rim. The elevational difference between the vents and the outer rim may be one type of blocking aspect helpful in protecting against blocking the vents. A planar object or other objects resting on top of the vents and the outer rim may be deflected, angled, or otherwise position due to the elevation differences such that the ability of the items to lay flat against the vents is limited. This may be on type of blocking aspect useful in protecting against blocking the vents so as to facilitate the continued flow of air to the components stored within the housing. A portion of the sunken bottom portion may optionally be reserved for labeling and other features instead of including venting, as shown. This may be helpful in providing aesthetic and/or advertising touches for viewing when the STBs in vertically orientated. Corresponding the labeling with the non-vented portion of the sunken portion may be helpful in preventing damage to the labels.

Figure 7:
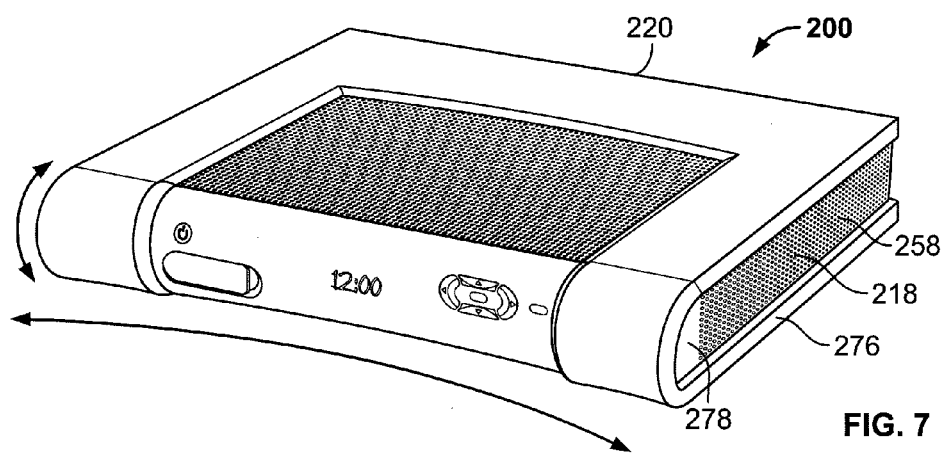
FIGS. 7-8 illustrate a STB in accordance with one non-limiting aspect of the present invention
Figure 8:
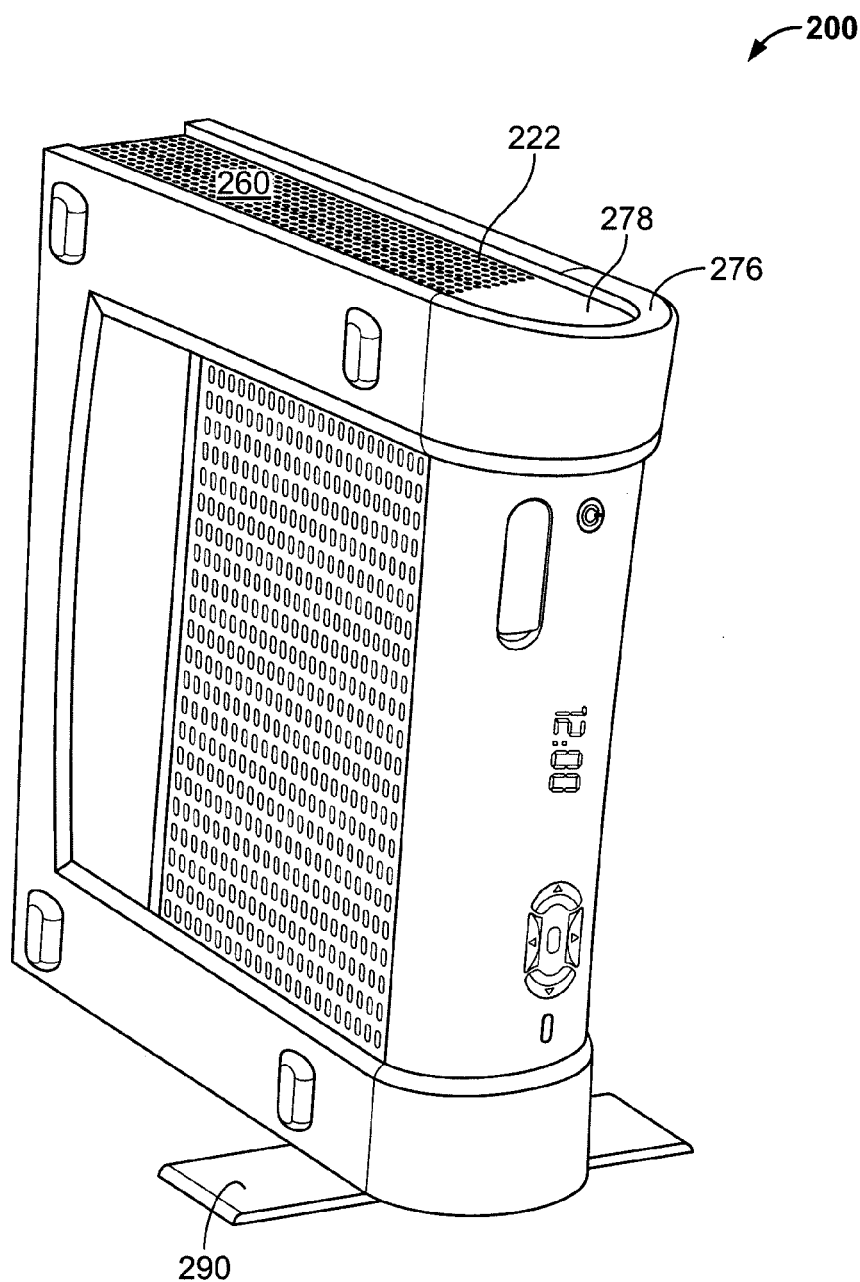

FIGS. 7-8 illustrate another STB 200 in accordance with one non-limiting aspect of the present invention. The STB 200 may include features similar to those describe above for the STBs 10 and 100, such as but not limited to the commonly illustrated features. The STB 200 may differ from the above STBs in the vents 258-260 on the sides 218 and 222 are not arched. Rather, the vents 258-260 may be located within a centrally sunken portion 278 having an elevation below an elevated outer rim portion 276 A planar object or other objects resting on top of the side vents and the outer rim may be deflected, angled, or otherwise position due to the elevation differences such that the ability of the items to lay flat against the vents is limited. This may be on type of blocking aspect useful in protecting against blocking the vents so as to facilitate the continued flow of air to the components stored within the housing.

The outer rim portion 276 may extend around most of the central portion 278 and be open at the rear end to facilitate upright placement of the STB 200 about the rear side 220. As shown in FIG. 8, the vertical alignment of the STB about the right side 218 may be facilitated with one or more stands 290. The stand 290 may by helpful if the STB 200 includes a relatively narrow side width so as to prevent the STB 200 from tipping over when vertically aligned. The stand 290 may cooperate with the outer rim portion to facilitate securing to the STB housing.

The above described STBs 10, 100, and 200 are describe for exemplary purposes and without intending the limit the scope and contemplation of the present invention. The present invention fully contemplates one or more feature from the STBs 10, 100, and 200 being included, adapted, and/or removed from one or more the illustrated examples and/or combined with another one of the examples. As such, the various illustrations are intended to reflect different design parameters and details that may be include in these and other housing so as to limit vent blocking, facilitate stability, and provide any number of advantageous features and advantages.

The present invention contemplates an optional need to appeal to a wide range of customers. STB may be products that will be required for all subscribers as the shift is made from analog to digital signals. These boxes may need to sit comfortably with older and newer technology. The boxes may be deployed with other A/V equipment in some cases while they may be the only equipment in add Won to a television in other scenarios. As MSOs assume greater control in communicating their company image through their products, it may be helpful if the image inspires confidence in consumers and develop a sense of brand equity. Users need to be confident in the quality of the product and the quality of their experience using products.

The design semantics of the present invention may be helpful defining the feelings that MSO products should inspire. The overall form of the box and the design details should be consistent with achieving these image goals. The forms may reflect regular geometric shapes rather than complex organic shapes and the buttons and controls may be organized and simplified to minimize visual clutter. Because of the great range of end users, the shapes and forms may be appealing to all age ranges without the forms should not threaten or intimidate users. The forms may inspire confidence in users in the quality of the products and in the integrity of the MSO. The products may stand securely and project an image of high quality construction and the fit and finish should be top quality and no aspects should have a flimsy or lesser quality appearance. The design may promote a sense that the product is easy to use and aid in correctly using and interacting with the product. The design may be an advertisement in the home for the MSO in that it may create a buzz about the innovative and future thinking that the MSO brings to their customers.

The front side curvature, top to bottom and/or side to side, may be helpful in providing a recognizable gesture or protective wrap that creates a visual metaphor of a protective shield from the environment. This wrap design incorporates all sides into the visual identity. The rounded front display bezel may create a soft and tactile surface, encouraging interaction with the STB. The venting and slight crown on the sides may make the STB more expressive. The step on top and in front continues to bottom panel showing that design has been applied on all surfaces.

The device may function correctly in either a horizontal or vertical configuration. There needs to be adequate airflow any orientation. The vertical orientation may have the MSO logo readable from top to bottom. An additional stand may be required to ensure stability and airflow as the product stands vertical. The device may be expected to function at a 55 C. ambient temperature with no internal fan. There may need to be adequate venting to achieve this goal in whichever configuration (vertical or horizontal) is chosen. There may be sufficient venting to keep the box functioning with some inadvertent vent blockage by users. Venting may be expected on the top, bottom, and sides. There should be at least 0.25" clearance underneath the device between the vents and the surface the device is standing on.

The design may promote placement of the device at the top of a stack of A/V components. This may help ensure adequate ventilation and avoid having the device sandwiched between components that can potentially block vents and exhaust hot air into the device. The design may help prevent accidental vent blockage. Possibilities include curved surfaces for vents or steps in the design. Ideally, a user placing a large flat object (magazine) on the unit will not block all the product vents. There may be a family resemblance between the various products of the product line. The devices do not need be scaled versions of each other, but there should be visual design cues which unify them as a family of MSO products.

The product may address operation needs to quickly service and re-deploy devices. The ease/difficulty of replacing may be considered. Durability of finishes may also be considered. Manufacturing costs may be kept at a minimum while still achieving the MSO image goals. The design may be sensitive to these desires and may minimize costs through the appropriate use of materials and manufacturing techniques. The display may provide an illuminated accent for the device. Specific color options may be available or may cycle automatically. Lightbar implementation may range from an illuminated foot to illuminated controls to backlit logos and icons.

The display may include: an IR receiver; channel/clock indicator; Firewire connectors (x2); USB connector; LED indicators for cable, power, and message; MSO Backlit logo; manufacturing partner logo at 75% size of MSO logo; and power button. The STBs may be handled roughly in the warehouses. Often they are placed front side down in lockers before being deployed in the field. The front surfaces and display areas may be damaged when the units are placed on their fronts. Lens or window areas may be recessed to prevent such damage. While the design of the devices may promote their placement at the top of a component stack by a customer, there is an operational need to stack the devices in the warehouses. Ideally the devices should be able to stack with themselves (while not necessarily with other devices). The STB may include a remote page button page the remote control. Remote control may emit a sound to aid in locating the unit, such but limiting to the use of Bluetooth technology.

Optionally, the dimension may be limited to the following dimensions: Depth: 28.321+/−1.27 cm; Height: 8.128+0.0/−0.508 cm; and Width: 39.878+/−1.27 cm. The total weight of the STB may be limited to 3.632 kilograms. The STB may include materials sufficient to protect against being deformed or disfigured in any way by the application of common household solvents, non abrasive cleaners or waxes to any exposed surfaces. The STB may provide suitable vibration isolation such that unit-generated continuous and/or random vibration shall not cause a sound pressure level greater than 25 dBA at a distance of one meter in any direction when resting on any common household surface. In addition, the vibration transferred to the resting surface may not be sufficient to cause the STB and/or other objects on the resting surface to vibrate and/or move. The STB fee may protect against altering common household surface for the life of the product. The feet may be long enough to provide appropriate separation between the set-top and the resting surface such that there may be appropriate space for sufficient air flow as required to comply with the heat and cooling requirements. The STB may have a power on/standby sound pressure noise level of no more than 25 dBA at a distance of 1 meter.

The STB may include any number of mechanic restraints and/or performance requirements. Except in video recording or playback mode, the STB may be able to withstand being dropped ten times, a distance of 15 cm onto its feet onto a hard surface with no perceptible effects on audio or video quality. In video recording or playback mode, the STB may be able to withstand being dropped a distance of 8 cm two times onto its feet onto a hard surface with no perceptible effects on audio or video quality. The STB may be operational within specifications after being dropped twice on any side without its shipping carton from a height of 75 cm onto a concrete floor. The STB may be configured not to incur any damage or visible deformation after the STB has been subjected to a static load of 45 Kg without its shipping carton. The STB may be operational within specifications and not develop any openings, creating the risk of electric shock, after being subjected to an impact force obtained by a 30 cm free fall of a solid smooth steel sphere weighing approximately 1.4 Kg. The STB may be fully operational within specification after exposure outside its shipping carton to a swept frequency vibration test applied in each of the three mutually perpendicular planes with a peak displacement of 5 mm each side of resting point, in each plane. The frequency may be varied uniformly from 7 to 30 cycles and back to 7 cycles per second ten times over a period of 60 minutes. Each button may provide 100,000 operations with a force of 225 grams exercised at a rate of once per second. Keys may withstand 12 kilogram load and in direction of travel.

The STB may be packaged into one shipping carton to enable staging and distribution in a manner that befits the MSO operational requirements. The carton may include a cut-out window that allows the barcode on the set-top device to be scanned without unpacking the carton. The cartons may be stacked to allow the bar codes on them to be accessible without unpacking the pallet. Each carton may have been designed to fit on a 48" by 40" pallet. Additional barcode labels may be affixed to the outside of the carton to convey extra information e.g. MAC addresses. Shipments may be accompanied by a data file containing box serialization information and MAC address information as defined in the MAC table. The file may be available via either a CD-ROM or an FTP location. The pallets used for shipping may conform to the following specifications: Dimensions: 120.00×100.00×13.0 cm; Maximum product overhang: 5.0 cm on the 100.00 cm side of the pallet; Single Pallet height with product: 130 cm; and Pallet stacking capacity: 2 pallets.

The STB may be fully operational within specification after an indefinite storage at 0° C. to 60° C., 30 days continuous storage at −10° C. to 70° C., and 7 days storage at −40° C. to 80° C. All conditions may be at a range of 5% to 95% relative humidity and between −60 meters and 4,500 meters in altitude. The STB may be limited to not exceeding 45° C. at 25° C. ambient temperature on any portion of its enclosure surface regardless of the airflow conditions. The STB may be fully operational within all specifications in a continuous still ambient air temperature environment of 15° C. to 40° C. A good user experience, defined as picture, sound, and data performance such that a diverse group of users feels performance is acceptable, may be provided in a continuous still ambient air temperature environment of 0° C. to 55° C. Environmental testing, intended to verify conformance with the requirements indicated in this section, may be conducted in a closed chamber of dimensions not larger that 1 cubic foot of air. The STB may be fully operational within specification after being subjected to the following thermal shock testing over 10 full cycles where the temperature transition occurs over a maximum interval of one half hour: −40° C. ambient for 4 hours and +60° C. ambient for 4 hours. The STB may be fully operational within specification after being subjected to the following humidity shock testing over ten complete cycles; Maintain +60° C. and 95% RH for 8 hours; Maintain +60° C. and 20% RH for 8 hours; Maintain +20° C. and 95% RH for 8 hours; and Maintain +20° C. and 20% RH for 8 hours.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A device having features to facilitate operations associated with processing signals, the device comprising: a housing for protecting the features associated with processing the signals, the housing including an interior portion for receiving the features, the housing having a top and bottom with sides extending therebetween, wherein each of the top, bottom, and at least two of the sides includes vents with block prevention aspects to facilitate venting the interior portion of the housing and to protect against the vents becoming blocked,
  wherein at least a portion of the vents are undulated relative to other portions of the vents to provide a varying elevation to protect against blocking the undulated vents,
  wherein at least one of the sides having at least two feet includes the vents within a central side portion arced above an elevation of an outer rim extending around at least a portion of the central side portion such that the arced elevational difference between the vents and the outer rim protects against the vents becoming blocked, and wherein the at least two feet on the at least one of the sides extend outward of the arced vents to secure the device housing when vertically orientated.

2. The device of claim 1 wherein at least a portion of the vents on the top are included within a central top portion sunken below an elevation of an outer rim extending around at least a portion of the central top portion such that the elevational difference between the vents and the outer rim protects against blocking the vents on the top.

3. The device of claim 2 wherein the bottom includes at least two feet to elevationally offset the bottom from a surface when placed on top of the surface, wherein the offset bottom protects against blocking the vents on the bottom.

4. The device of claim 3 wherein the feet are positioned on the bottom to correspond with the outer rim of the top so as to facilitate stacking the device.

5. The device of claim 4 wherein at least one of the sides is a front side having a display, wherein the outer rim of the top wraps around and extends outwardly relative to the portion of the front side having the display so as to protect the display.

6. The device of claim 3 wherein the at least one of the sides includes the at least two feet to elevationally offset the at least one of the sides from a surface when placed on top of the surface, wherein the offset of at least one of the sides protects against blocking the vents on the at least one of the sides.

7. The device of claim 1 wherein at least one of the sides is a front side and includes a display for displaying information associated with operating the device.

8. The device of claim 7 wherein a portion of the front side corresponding with the display is recessed to protect the display.

9. The device of claim 8 wherein at least a portion of the recessed portion of the front side is arced inwardly from side to side.

10. The device of claim 7 wherein an orientation of characters of the display is automatically controlled to correspond with an orientation of the device.

11. The device of claim 1 further comprising a locating feature to facilitate locating a remote control configured to remotely control the device.

12. The device of claim 11 further comprising a navigation grid that matches a navigation grid on the remote control.

13. A device comprising: a housing including an interior portion defined relative to a top and bottom with sides extending therebetween, wherein at least one of the top, bottom, and sides includes vents to facilitate venting the interior portion; feet on the bottom and the at least one of the sides, the feet being sufficient to offset the bottom and side when the feet are placed against surfaces so as to protect against blocking vents; and wherein the feet are sufficient to permit the device to operate while being horizontally or vertically orientated,
  wherein at least a portion of the vents are undulated relative to other portions of the vents in order to provide a varying elevation so as to protect against blocking the undulated vents,
  wherein the side having the feet includes the vents within a central side portion arced above an elevation of an outer rim extending around at least a portion of the central side portion such that the arced elevational difference between the vents and the outer rim protects against the vents becoming blocked, and wherein the feet on the side extend outward of the arced vents to secure the device housing when vertically orientated.

14. The device of claim 13 wherein at least a portion of a front side is arced inwardly from side to side and at least a portion of the front side is arched outwardly from top to bottom.

15. The device of claim 13 wherein a hard drive, processing chip, and conditional access feature are included within the interior and positioned relative to the vents to facilitate the cooling thereof.

16. The device of claim 15 wherein the vents are sufficient to cool the interior such that the interior is sufficiently cooled through convection and without forced air flow from a fan.

17. A device housing comprising: a top and bottom with sides extending therebetween for defining an interior portion for receiving components associated with operating the device, wherein at least one of the top, bottom, and sides includes vents to facilitate venting the interior portion; and feet on the bottom and at least one of the sides, the feet on the bottom being sufficient to secure the device housing when horizontally orientated and the feet on the side being sufficient to secure the device housing when vertically orientated,
  wherein at least a portion of the vents are undulated relative to other portions of the vents in order to provide a varying elevation so as to protect against blocking the undulated vents,
  wherein the side having the feet includes the vents within a central side portion arced above an elevation of an outer rim extending around at least a portion of the central side portion such that the arced elevational difference between the vents and the outer rim protects against the vents becoming blocked, and wherein the feet on the side extend outward of the arced vents to secure the device housing when vertically orientated.

18. The housing of claim 17 further comprising the interior portion sufficient to house a hard drive, processing chip, and conditional access feature and wherein the vents are sufficient to cool the interior portion through convection and without forced air flow from a fan.

* * * * *